United States Patent
Ha et al.

(10) Patent No.: US 8,040,720 B2
(45) Date of Patent: Oct. 18, 2011

(54) PHASE-CHANGE MEMORY DEVICE INCLUDING BIASING CIRCUIT

(75) Inventors: Daewon Ha, Seoul (KR); Young-joo Jeon, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 199 days.

(21) Appl. No.: 12/467,337

(22) Filed: May 18, 2009

(65) Prior Publication Data

US 2009/0285015 A1    Nov. 19, 2009

(51) Int. Cl.
*G11C 11/00* (2006.01)
(52) U.S. Cl. ............ 365/163; 365/148; 365/174
(58) Field of Classification Search .......... 365/163, 365/148, 174
See application file for complete search history.

(56) References Cited

U.S. PATENT DOCUMENTS

| | | | |
|---|---|---|---|
| 5,818,749 A * | 10/1998 | Harshfield | 365/105 |
| 7,812,404 B2 * | 10/2010 | Herner et al. | 257/390 |
| 2003/0073262 A1 * | 4/2003 | Xu et al. | 438/102 |
| 2006/0186479 A1 | 8/2006 | Cho et al. | |
| 2007/0133271 A1 | 6/2007 | Cho et al. | |
| 2008/0062741 A1 * | 3/2008 | Choi et al. | 365/148 |

FOREIGN PATENT DOCUMENTS

| | | |
|---|---|---|
| JP | 2006-237605 | 9/2006 |
| JP | 2007-157317 | 6/2007 |
| KR | 1020060094424 A | 8/2006 |
| KR | 1020060133394 A | 12/2006 |
| KR | 1020070056667 A | 6/2007 |

* cited by examiner

*Primary Examiner* — Vu Le
*Assistant Examiner* — Han Yang
(74) *Attorney, Agent, or Firm* — Volentine & Whitt, PLLC

(57) ABSTRACT

A memory cell device is provided which includes a substrate, a plurality of unit memory cells connected between a word line and respective bit lines, where each memory cell including a resistance variable element, such a phase-change element, and a diode connected in series between the word line and the respective bit line, and a biasing circuit which applies a biasing voltage to the substrate to decrease a current flow in the word line.

16 Claims, 9 Drawing Sheets

PHASE-CHANGE MEMORY DEVICE INCLUDING BIASING CIRCUIT

PRIORITY CLAIM

A claim of priority is made to Korean patent application 10-2008-0046139, filed May 19, 2008, the disclosure of which is incorporated herein in its entirety.

SUMMARY

The present invention generally relates to non-volatile memory devices, and more particularly, the present invention relates to phase-change memory devices, such as phase-change random access memory (PRAM) devices.

Phase-change random access memory (PRAM) devices are non-volatile memory devices, in which each memory cell is generally comprised of a phase-change material pattern and a switching element connected in series between a bit line and a word line. In one type of PRAM, referred to herein as a diode-PRAM, the switching element is implemented by a diode, and thus each of the memory cell includes a phase change material pattern and a cell diode electrically connected in series between a bit line and a word line. For example, an N-type semiconductor region of the cell diode may be electrically connected to the word line, and the phase change material pattern may be electrically connected to the bit line.

As described in commonly assigned U.S. Patent Publication No. 2006/0186483 to Cho et al., dated Aug. 24, 2006, which is incorporated herein by reference in its entirety, one drawback of the diode-PRAM reside in the formation of parasitic bipolar transistors which can adversely impact the sensing margin of the diode-PRAM in a read operation. That is, each word line can function as a base region of a lateral bipolar transistor, which is parasitically formed between the adjacent phase change cells. In this case, if the electrical resistance of the word lines (that is, the base region) increases, current gain of the parasitic lateral bipolar transistor may increase. When the current gain of the parasitic lateral bipolar transistor increases, a voltage induced to a bit line electrically connected to a selected phase change cell may be temporarily unstable during a read operation associated with the selected phase change cell. This is because a large charging current corresponding to a collector current of the parasitic bipolar transistor may flow through a bit line of a non-selected phase change cell adjacent to the selected phase change cell.

According to an aspect of the present invention, a memory cell device is provided which includes a substrate, a plurality of unit memory cells connected between a word line and respective bit lines, each memory cell including a resistance variable element and a diode connected in series between the word line and the respective bit line, and a biasing circuit which applies a biasing voltage to the substrate to decrease a current flow in the word line.

According to another aspect of the present invention, a phase-change memory cell device is provided which includes a phase-change memory cell array and a biasing circuit. The phase-change memory cell array includes a plurality of diode-type phase-change memory cells connected between a common word line and a plurality of respective bit lines, where the word line is located on an impurity region of a substrate. The biasing circuit is operative in an active mode to bias the impurity region to reduce a current flow in the word line, and operative in a standby mode to cease the biasing of the impurity region.

According to still another aspect of the present invention, a method of reading a phase-change memory device is provided, where the phase-change memory device includes a plurality of diode-type phase-change cells connected between a common word line and a plurality of respective bit lines, and wherein the word line is formed on a substrate. The method includes biasing the substrate to reduce a current flow of the word line during an active mode of the phase-change memory device.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF EMBODIMENTS

The present invention will be described in detail below by way of preferred, but non-limiting, embodiments of the invention. The embodiments presented herein are considered examples of various implementations of the invention, and are not intended to limit or specifically define the overall scope of the invention.

For ease of understanding and to avoid redundancy, like reference numbers refer to the same or similar elements throughout the drawings. Also, while the drawings contain a number of circuit elements, it will be understood from the nature of electrical circuits that when an element is described as being connected to another element, it can be directly connected the other element or one or more intervening elements may be present. In contrast, if an element is referred to as being "directly connected to" another element, then no intervening elements are present. Other words used to describe the relationship between elements should be interpreted in a like fashion (e.g., "between" versus "directly between," "adjacent" versus "directly adjacent," "connected" versus "directly connected," etc.).

As is traditional in the field of the present invention, embodiments of the invention may be described at least partially in terms of functional blocks or units. It will be readily understood that the functional blocks or units denote electronic circuits which are configured (e.g., by dedicated and/or programmable circuitry) to execute the signaling and/or computational operations described herein. Also, it will be readily understood that one or more functional blocks may be physically combined into complex circuitry without departing from the spirit and scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
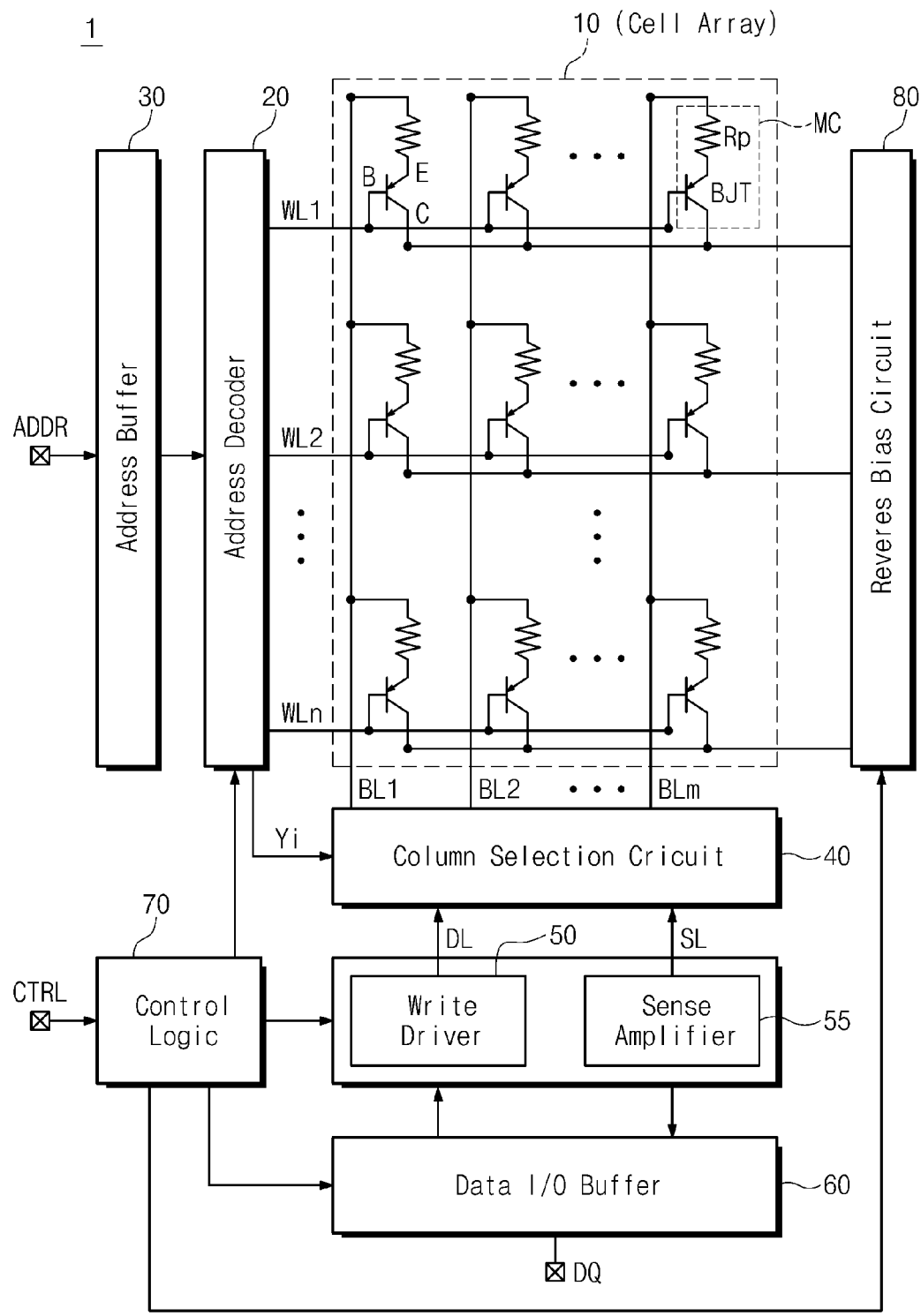
FIG. 1 is a block diagram of a phase-change memory device according to an embodiment of the present invention.

FIG. 1 is a block diagram illustrating a memory device according to an embodiment of the present invention.

As shown in FIG. 1, the memory device 1 of this example includes a memory cell array 10, an address decoder 20, an address buffer 30, a column selection circuit 40, a write driver 50, and sense amplifier 55, a data input/output (I/O) buffer 60, control logic 70, and a reverse bias circuit 80.

The control logic 70 receives commands via a control terminal CTRL to control read and write operations of the memory device 1. In particular, in a write operation, write data is received via a data terminal DQ and addresses are received via an address terminal ADDR. In accordance with commands received via the control terminal CTRL, the control logic 70 controls the I/O buffer 60 to pass the write data to the write driver 50, which is responsive thereto to drive a data line DL. In response to address information from the address buffer 30, the address decoder 20 activates one of the word lines WL1~WLn, and controls the column selection circuit 40 to electrically connect the data line DL to one of the bit lines BL1~BLm.

In a read operation, in response to address information from the address buffer 30, the address decoder activates one of the word lines WL1~WLn, and controls the column selection circuit 40 to electrically connect a sense line SL to one of the bit lines BL1~BLm. The sense amplifier 55 is responsive to the control logic 70 to sense a data state of a selected memory cell MC, and corresponding output data is applied to the data terminal DQ via the I/O buffer 60.

The memory cell array 10 includes a plurality of unit memory cells MC connected between a plurality of word lines WL1~WLm and a plurality of bit lines BL1~BLm. For convenience of explanation, each of the memory cells MC of FIG. 1 is illustrated as including a phase-change element Rp and a bipolar junction transistor BJT. The physical configuration of each memory cell MC, however, is more aptly described at as including a phase-change element Rp and a diode connected series between a word line WL and a bit line BL.

Figure 2:
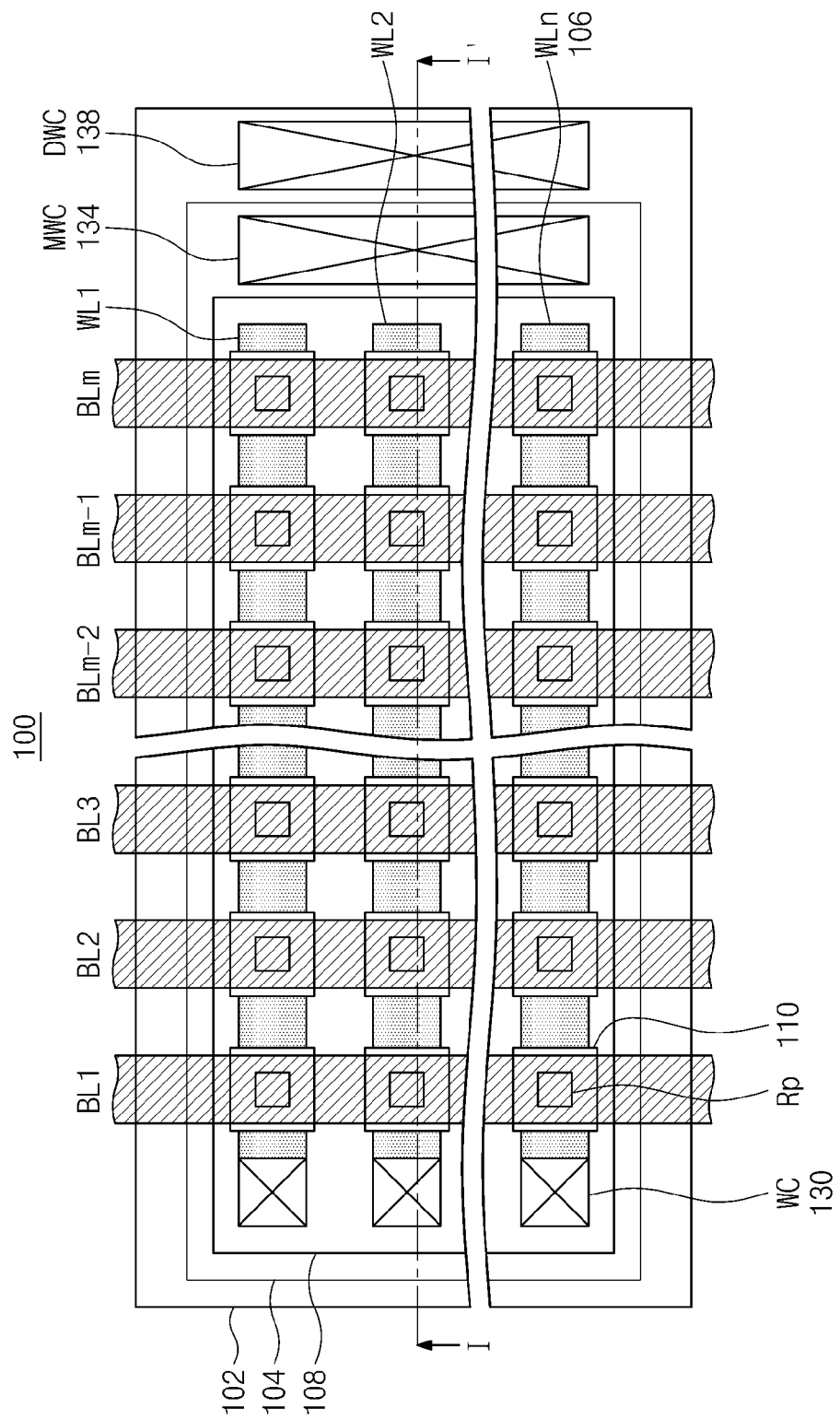
FIG. 2 is a plan view of a phase-change memory cell array of FIG. 1 according to an embodiment of the present invention.
Figure 3:
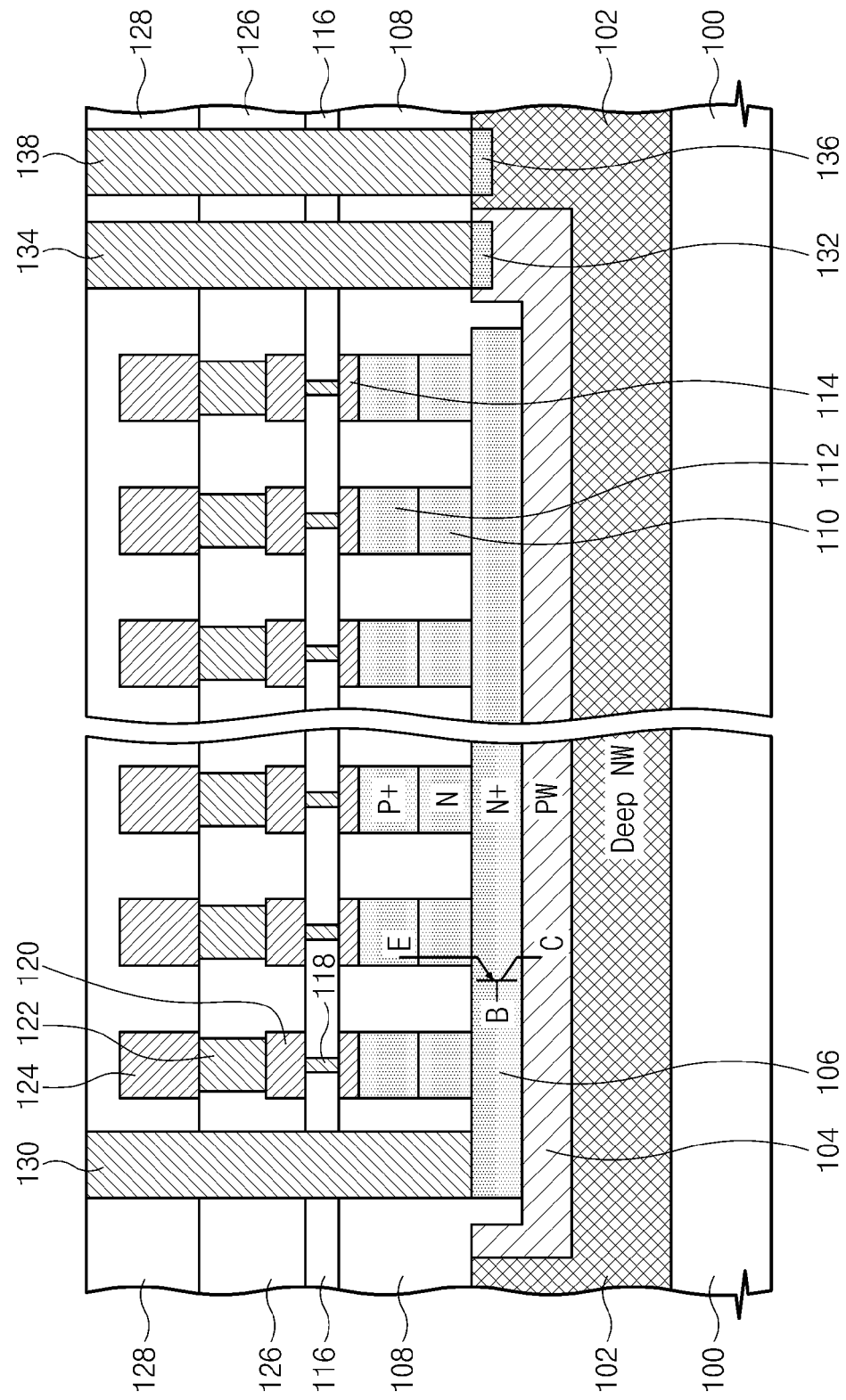
FIG. 3 is a cross-sectional view taken along line III-III' of FIG. 2 according to an embodiment of the present invention.
Figure 4:
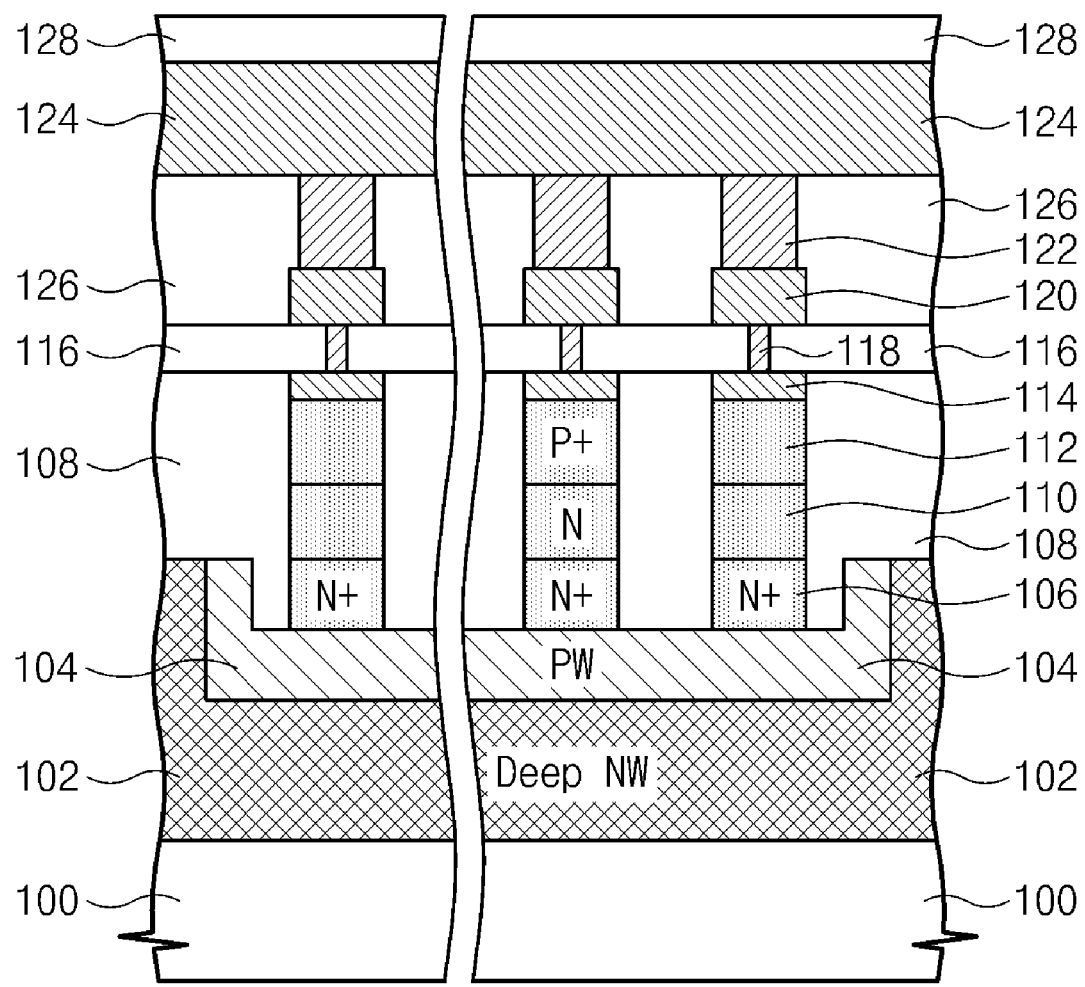
FIG. 4 is a cross-sectional view taken along line IV-IV" of FIG. 2 according to an embodiment of the present invention.

FIG. 2 is a plan view illustrating a portion 100 of a cell array region, FIG. 3 is a cross sectional view taken along the line III-III' of FIG. 2, and FIG. 4 is a cross sectional view taken along the line IV-IV' of FIG. 3. Collectively, FIGS. 2~4 illustrate a portion of the cell array 10 illustrated in FIG. 1 according to an embodiment of the present invention.

Referring to FIGS. 2~4, a deep N-type well (NW) 102 and a P-type well (PW) 104 are located in a semiconductor substrate 100. A plurality of word lines (WL1~WLm) 106 extend in a first direction over the P-type well 104, a plurality of insulating layers (or mold layers) 108, 116, 126 and 128 are stacked over the word lines 106, and a plurality of bit lines (BL1~BLn) 124 extend orthogonal the first direction within the insulating layer 128.

A plurality of unit memory cells are located between the word lines 106 and bit lines 124, where each memory cell includes a phase-change material Rp and a diode electrically connected in series between a word line 106 and a bit line 124. That is, in the example of this embodiment, a unit cell diode is formed by a P+-type pattern 112 and an N-type pattern 110 formed in the insulating layer 108. Also according to the example of this embodiment, a metal (or conductive) plug 114 is located on the P+-type pattern 112 within the insulating layer 108. Another metal (or conductive) plug 118, which functions as a heating element, is located within the insulating layer 116 and contacts the metal plug 114. A phase-change material pattern (Rp) 120 is located within the insulating material 126 and contacts the metal plug 118, and another metal (or conductive) plug 122 is located in the insulating material 126 so as to connect the phase-change material pattern 120 to the bit line 124.

The metal plug (heater) 118 may, for example, be formed of a high resistivity material, such as TiAlN or TiN, and the phase-change material pattern 120 may, for example, be formed of a chalcogenide material, such as GST ($Ge_2Sb_2Te_5$). Programming of the phase-change material 120 is achieved in a known manner by causing the metal plug 118 to selectively heat the material 120 to alter the material phase thereof. The amount and duration of the applied thermal energy is controlled according to a current flow between the bit line 124 and word line 106.

Examples of materials and techniques which may be utilized to fabricate selected elements of the array described above may be found in the previously mentioned and commonly assigned U.S. patent publication 2006/0186483.

Word line contact (WC) contacts 130, a well contact 134, and a deep well contact (DWC) 138 extend through the insulating layers 128, 126, 116 and 108 to provide electrical access to the word lines 106, P-type well 104 and deep N-type well 102, respectively.

Referring to FIG. 3 in particular, a parasitic bipolar transistor BJT is formed at the interface of each diode (110, 112) and the word line 106. In particular, an emitter E is defined at the P+-type pattern 112, a collector C is defined a the P-type well (PW) 104, and a base B is defined by the word line 106.

In operation, a resistance of the N+-type word line creates a voltage drop which can reduce a sensing margin of the memory device. This results from a relatively large current flowing through the word line 106 (i.e., through the base B of the parasitic BJT).

According to the present embodiment, the sensing margin is enhanced by biasing the P-type well (PW) 104 to draw current into the underlying substrate 100 (or deep N-type well 102). In this manner, the current flow through the word line 106 is reduced, and thus the voltage drop across the word line 106 is reduced. For example, where the word line 106 is N-type, current may be drawn from the word line 104 by biasing the substrate (e.g., the P-type well 104) to a negative voltage.

Returning to FIG. 1, substrate biasing is achieved according the present embodiment by the reverse bias circuit 80. In particular, the reverse bias circuit 80 is responsive to the control logic 70 to negatively bias the P-type well 104 shown in FIGS. 3 and 4. This may be done, for example, by application of a negative voltage to the well contact (MWC) 134.

Further, in order to minimize current consumption, the control logic 70 may be operative to effectively disable the reverse bias circuit 80 in a standby mode of the memory device 1. In this case, the biasing voltage is applied to the substrate (e.g, P-type well 104) when the phase-change memory cell device is an active mode, and the biasing voltage is not applied to the substrate (e.g, P-type well 104) when the phase-change memory cell device is in a standby mode.

In the embodiment described above, a common P-type well 104 is provided for the memory cell array. Another embodiment of the present invention will be described next in which separate P-type well regions are provided for each of the word lines.

Figure 5:
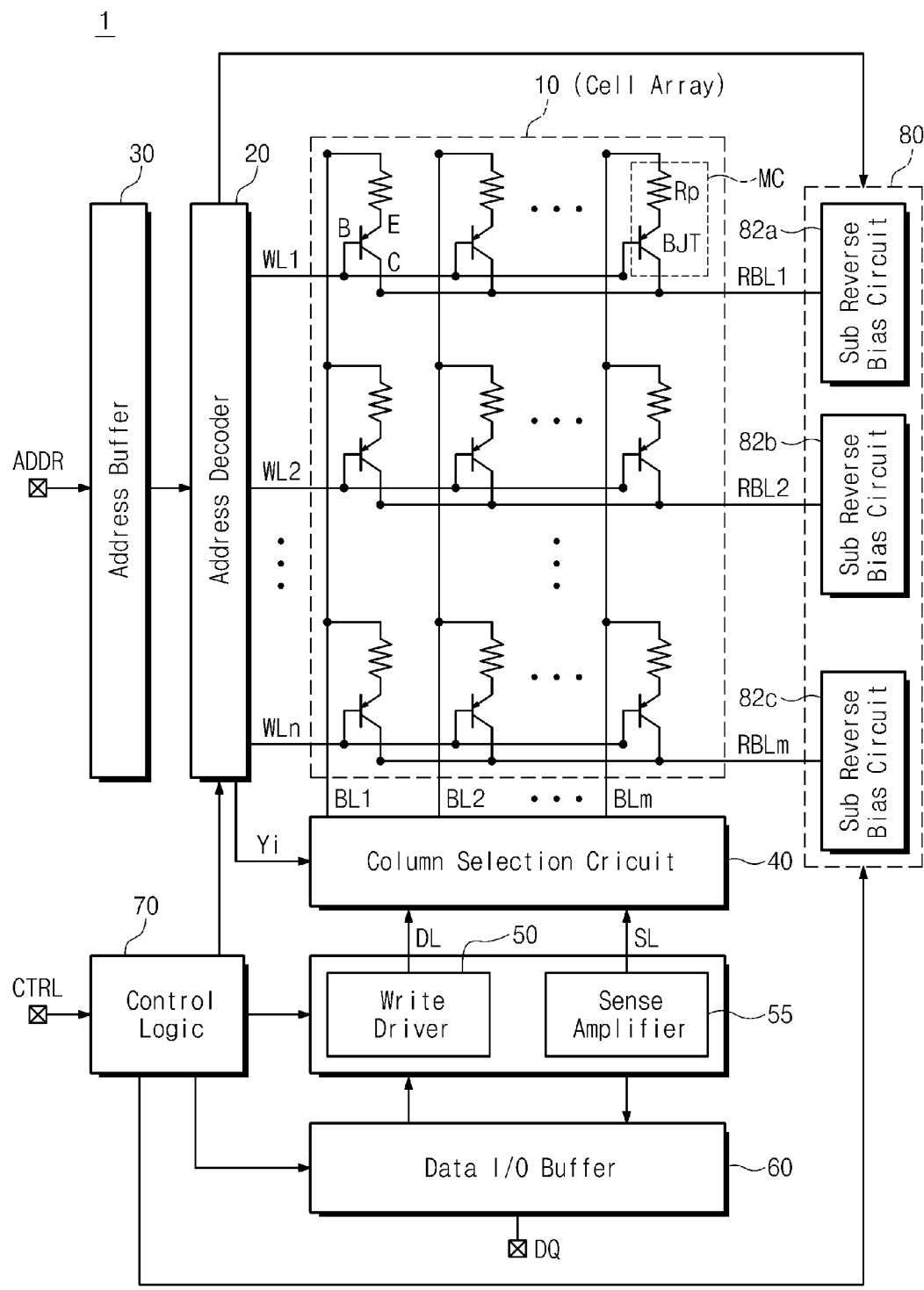
FIG. 5 is a block diagram of a phase-change memory device according to another embodiment of the present invention.

FIG. 5 is a block diagram illustrating a memory device according to an embodiment of the present invention.

As shown in FIG. 5, the memory device 1 of this example includes a memory cell array 10, an address decoder 20, an address buffer 30, a column selection circuit 40, a write driver 50, and sense amplifier 55, a data input/output (I/O) buffer 60, control logic 70, and a reverse bias circuit 80.

The control logic 70 receives commands via a control terminal CTRL to control read and write operations of the memory device 1. In particular, in a write operation, write data is received via a data terminal DQ and addresses are received via an address terminal ADDR. In accordance with commands received via the control terminal CTRL, the control logic 70 controls the I/O buffer 60 to pass the write data to the write driver 50, which is responsive thereto to drive a data line DL. In response to address information from the address buffer 30, the address decoder 20 activates one of the word lines WL1~WLn, and controls the column selection circuit 40 to electrically connect the data line DL to one of the bit lines BL1~BLm.

In a read operation, in response to address information from the address buffer 30, the address decoder activates one of the word lines WL1~WLn, and controls the column selection circuit 40 to electrically connect a sense line SL to one of the bit lines BL1~BLm. The sense amplifier 55 is responsive to the control logic 70 to sense a data state of a selected memory cell MC, and corresponding output data is applied to the data terminal DQ via the I/O buffer 60.

The memory cell array 10 includes a plurality of unit memory cells MC connected between a plurality of word lines WL1~WLm and a plurality of bit lines BL1~BLm. For convenience of explanation, each of the memory cells MC of FIG. 5 is illustrated as including a phase-change element Rp and a bipolar junction transistor BJT. The physical configuration of each memory cell MC, however, is more aptly described at as including a phase-change element Rp and a diode connected series between a word line WL and a bit line BL.

Figure 6:
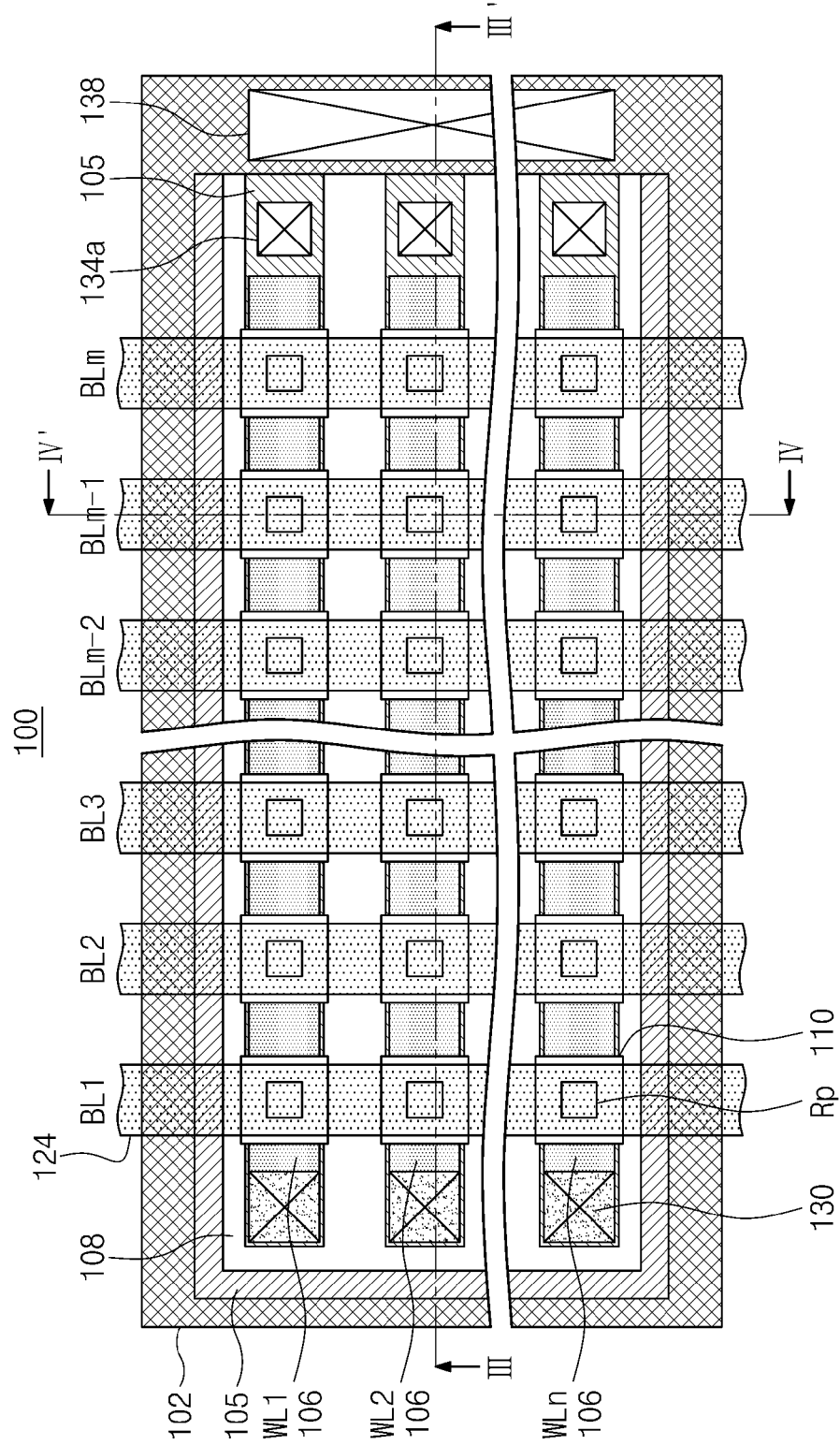
FIG. 6 is a plan view of a phase-change memory cell array of FIG. 5 according to an embodiment of the present invention.
Figure 7:
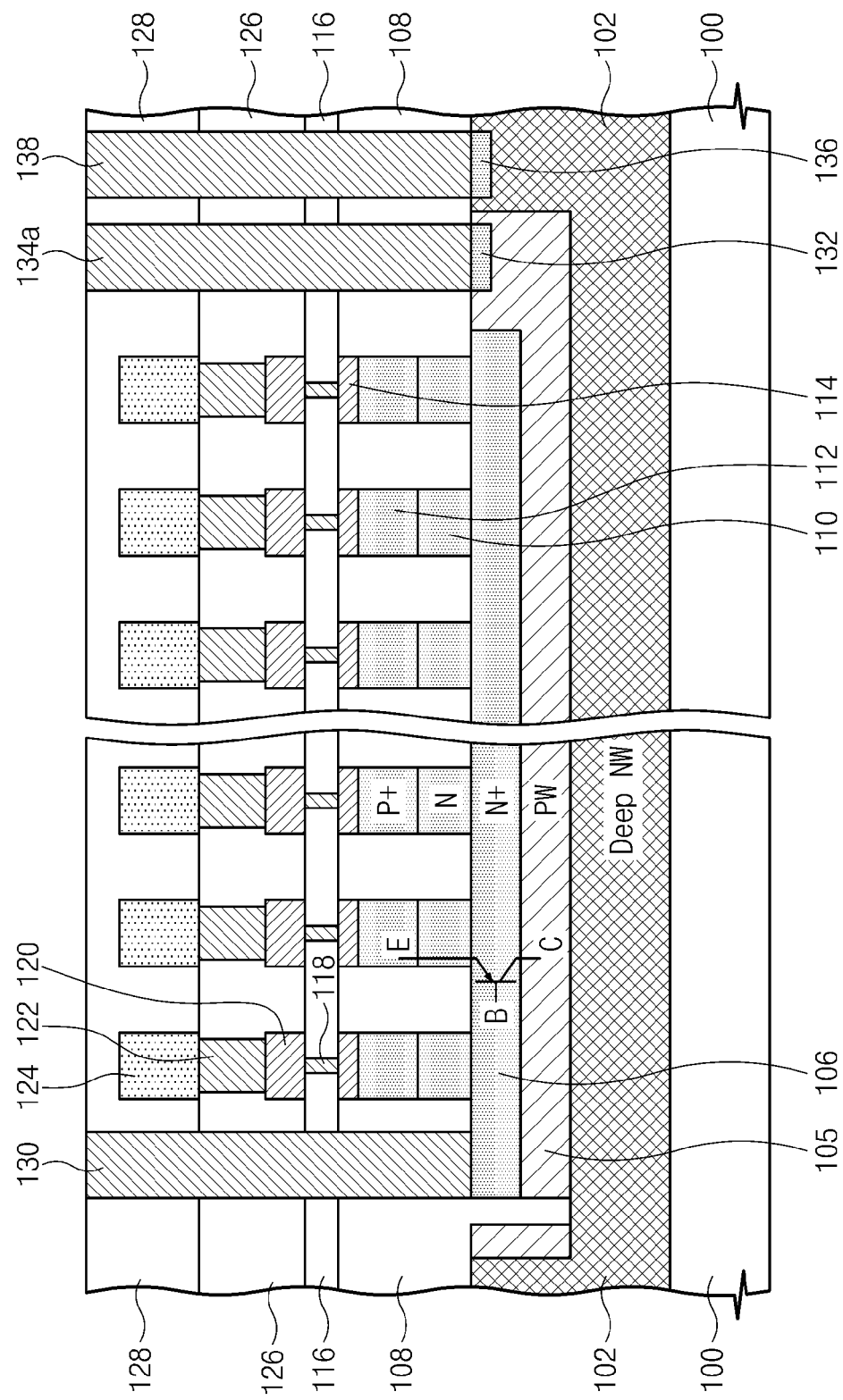
FIG. 7 is a cross-sectional view taken along line III-III' of FIG. 6 according to an embodiment of the present invention.
Figure 8:
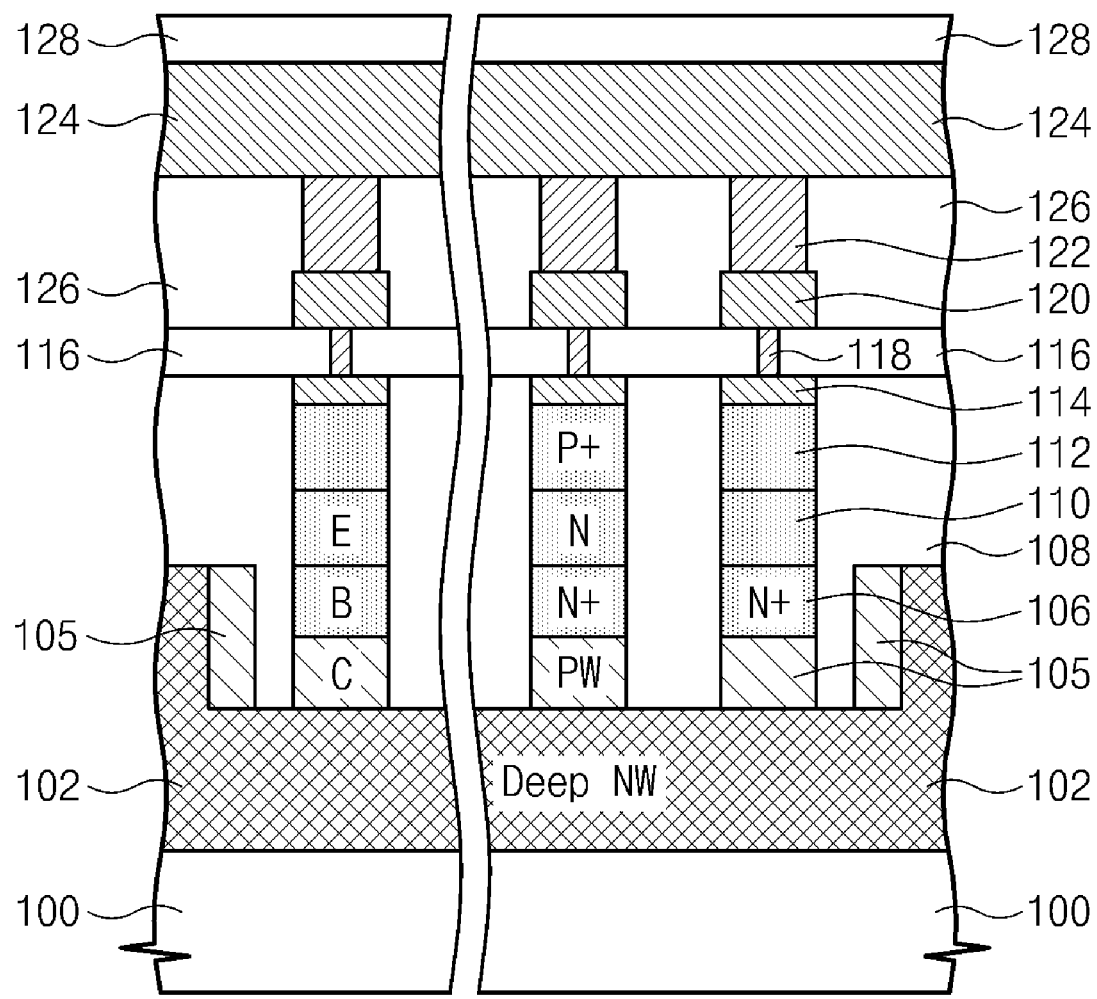
FIG. 8 is a cross-sectional view taken along line IV-IV" of FIG. 6 according to an embodiment of the present invention.

FIG. 6 is a plan view illustrating a portion 100 of a cell array region, FIG. 7 is a cross sectional view taken along the line III-III' of FIG. 6, and FIG. 8 is a cross sectional view taken along the line IV-IV' of FIG. 6. Collectively, FIGS. 6~8 illustrate a portion of the cell array 10 illustrated in FIG. 5 according to an embodiment of the present invention.

Referring to FIGS. 6~8, a deep N-type well (NW) 102 and a plurality P-type well (PW) patterns 105 are located in a semiconductor substrate 100. A plurality of word lines (WL1~WLm) 106 extend in a first direction over the respective the P-type well patterns 105, a plurality of insulating layers (or mold layers) 108, 116, 126 and 128 are stacked over the word lines 106, and a plurality of bit lines (BL1~BLn) 124 extend orthogonal the first direction within the insulating layer 128.

A plurality of unit memory cells are located between the word lines 106 and bit lines 124, where each memory cell includes a phase-change material Rp and a diode electrically connected in series between a word line 106 and a bit line 124. That is, in the example of this embodiment, a unit cell diode is formed by a P+-type pattern 112 and an N-type pattern 110 formed in the insulating layer 108. Also according to the example of this embodiment, a metal (or conductive) plug 114 is located on the P+-type pattern 112 within the insulating layer 108. Another metal (or conductive) plug 118, which functions as a heating element, is located within the insulating layer 116 and contacts the metal plug 114. A phase-change material pattern (Rp) 120 is located within the insulating material 126 and contacts the metal plug 118, and another metal (or conductive) plug 122 is located in the insulating material 126 so as to connect the phase-change material pattern 120 to the bit line 124.

The metal plug (heater) 118 may, for example, be formed of a high resistivity material, such as TiAlN or TiN, and the phase-change material pattern 120 may, for example, be formed of a chalcogenide material, such as GST ($Ge_2Sb_2Te_5$). Programming of the phase-change material 120 is achieved in a known manner by causing the metal plug 118 to selectively heat the material 120 to alter the material phase thereof. The amount and duration of the applied thermal energy is controlled according to a current flow between the bit line 124 and word line 106.

Like the previous embodiment, examples of materials and techniques which may be utilized to fabricate selected elements of the array described above may be found in the previously mentioned and commonly assigned U.S. patent publication 2006/0186483.

Word line contact (WC) contacts 130, well contacts 134a, and a deep well contact (DWC) 138 extend through the insulating layers 128, 126, 116 and 108 to provide electrical access to the word lines 106, P-type well patterns 105 and deep N-type well 102, respectively.

Referring to FIG. 7 in particular, a parasitic bipolar transistor BJT is formed at the interface of each diode (110, 112) and the word line 106. In particular, an emitter E is defined at the P+-type pattern 112, a collector C is defined a the P-type well (PW) pattern 105, and a base B is defined by the word line 106.

In operation, a resistance of the N+-type word line creates a voltage drop which can reduce a sensing margin of the memory device. This results from a relatively large current flowing through the word line 106 (i.e., through the base B of the parasitic BJT).

According to the present embodiment, the sensing margin is enhanced by separately biasing the P-type well (PW) patterns 105 to draw current into the underlying substrate 100 (or deep N-type well 102). In this manner, the current flow through the word line 106 is reduced, and thus the voltage drop across the word line 106 is reduced. For example, where the word line 106 is N-type, current may be drawn from the word line 106 by biasing the substrate (e.g., the P-type well patterns 105) to a negative voltage.

Returning to FIG. 5, substrate biasing is achieved according the present embodiment by the reverse bias circuit 80. In particular, the reverse bias circuit 80 includes a plurality of sub-reverse biasing circuits having respective biasing lines RBL1~RBLn that are electrically connected to the respective P-type well patterns 105 (i.e., to the respective well contacts 134a).

Each of the sub-reverse biasing circuits is responsive to the control logic 70 to negatively bias a respective P-type well pattern 105 shown in FIGS. 6 and 7. This may be done, for example, by application of a negative voltage to a corresponding well contact (MWC) 134a.

Further, in order to minimize current consumption, the control logic 70 may be operative to effectively disable the sub-reverse bias circuits associated with non-addressed word lines WL, or to effectively disable all the sub-reverse bias circuits when the memory device 1 is in a standby mode.

Figure 9:
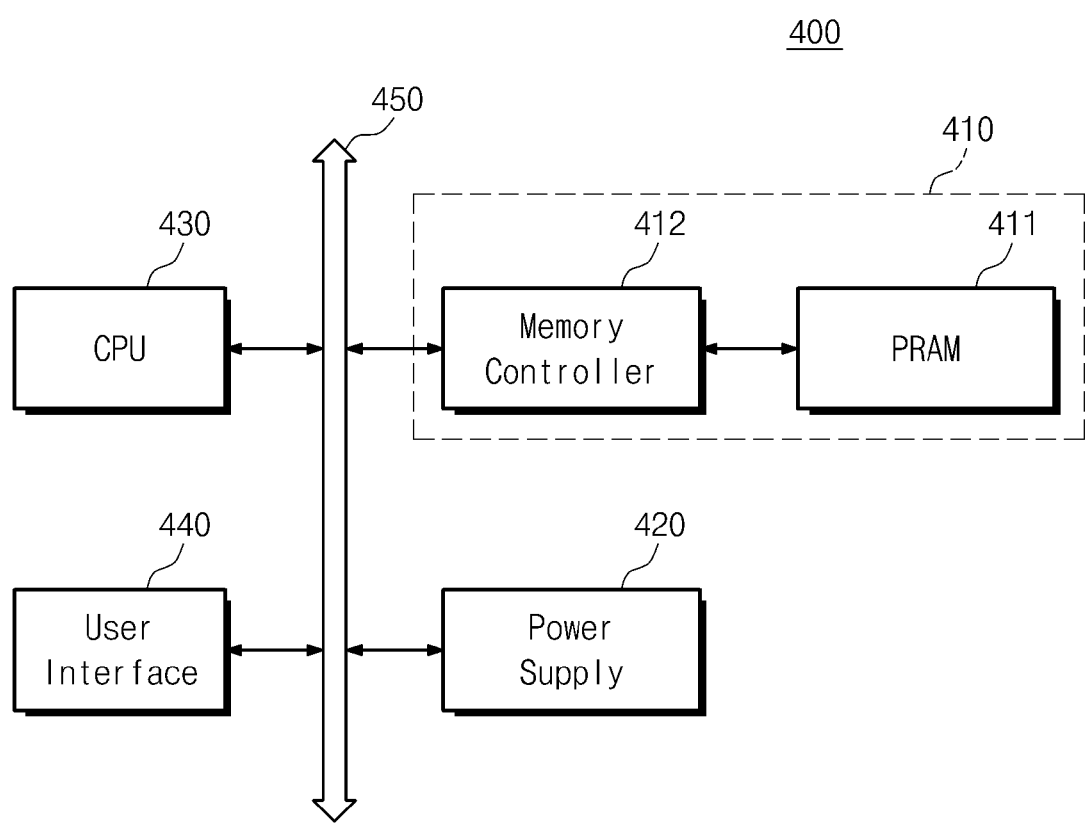
FIG. 9 is a block diagram illustrating a system according to an embodiment of the present invention.

FIG. 9 is a block diagram of a computer system according to an embodiment of the present invention. As shown, the computer system 400 includes a central processing unit (CPU) 430, a user interface 440, a power supply 420 and a memory device 410 all connected to a bus system 450. The memory device 410 includes a memory controller 412 which interfaces with the bus system 450 and which controls read and write operations of a phase-change random access (PRAM) memory 411. The PRAM 411 is configured according to one or more of the previously described embodiments, or variations thereof. For example, the PRAM 411 may include a biasing circuit which applies a biasing voltage to a substrate (or impurity region thereof) in order to decrease a current flow in the word line and thus increase a sensing margin.

It should be noted that the preceding embodiments are not limited to the particular selection of N-type and P-type conductivities described above. Also, the embodiments are not limited the particular configuration of layers as described above.

Also, the embodiments herein are not limited to PRAM memory cells, and may be applied to other types of memory cells which utilized a material which varies in resistance in order to store data. Such memory cells are denoted herein as resistance variable memory cells.

In other words, the foregoing is illustrative of the present invention and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory cell device, comprising:
   a substrate;
   a plurality of unit memory cells connected between a word line and respective bit lines, each memory cell including a resistance variable element and a diode connected in series between the word line and the respective bit line;
   a biasing circuit which applies a biasing voltage to the substrate to decrease a current flow in the word line.

2. The memory device of claim 1, wherein the resistance variable element is a phase-change material.

3. The memory device of claim 2, wherein the phase-change material includes a chalcogenide material.

4. The memory device of claim 1, further comprising an impurity region of a first conductivity type in the substrate, wherein the word line is a conductive pattern of a second conductivity type and is located on the impurity region, and
   wherein the biasing voltage is applied to the impurity region.

5. The memory device of claim 4, wherein the biasing circuit applies the biasing voltage to the impurity region when the memory device is an active mode, and wherein the biasing circuit ceases application of the biasing voltage to the impurity region when the memory device is in a standby mode.

6. The memory device of claim 4, wherein the first conductivity type is a P-type, and the second conductivity type is an N-type, and wherein the biasing voltage is a negative voltage.

7. The memory device of claim 6, wherein the diode of each memory cell includes an impurity region of the second conductivity type connected to the word line.

8. The memory device of claim 1, further comprising a plurality of impurity patterns of a first conductivity type located at a surface of the substrate, wherein the word line is one of a plurality of word lines of a second conductivity type located on the respective impurity patterns, and
   wherein the biasing voltage is separately applied to the plurality of impurity patterns.

9. The memory device of claim 8, wherein the biasing circuit selectively applies the biasing voltage to the impurity patterns according to an addressed word line among the plurality of word lines when the memory device is an active mode, and wherein the biasing circuit ceases application of the biasing voltage to the impurity patterns when the memory device is in a standby mode.

10. The memory device of claim 8, wherein the first conductivity type is a P-type, and the second conductivity type is an N-type, and wherein the biasing voltage is a negative voltage.

11. A phase-change memory cell device, comprising:
    a phase-change memory cell array comprising a plurality of diode-type phase-change memory cells connected between a common word line and a plurality of respective bit lines, wherein the word line is located on an impurity region of a substrate; and
    a biasing circuit operative in an active mode to bias the impurity region to reduce a current flow in the word line, and operative in a standby mode to cease the biasing of the impurity region.

12. The phase-change memory cell device of 11, wherein the phase-change memory cell array comprising a plurality of word lines respectively located on a plurality of impurity regions, wherein the plurality of impurity regions are electrically isolated from one another, and
    wherein the biasing circuit is operatively in the active mode to selectively and individually bias the plurality of impurity regions.

13. A method of reading a phase-change memory device, the phase-change memory device comprising a plurality of diode-type phase-change cells connected between a common word line and a plurality of respective bit lines, wherein the word line is formed on a substrate, the method comprising biasing the substrate to reduce a current flow of the word line during an active mode of the phase-change memory device.

14. The method of claim 13, further comprising stopping the biasing of the substrate in a standby mode of the phase-change memory device.

15. The method of claim 13, wherein the biasing of the substrate comprises applying a biasing voltage to an impurity region in contact with the word line.

16. The method of claim 15, wherein the biasing voltage is a negative voltage.

* * * * *